United States Patent
De Weerdt

(10) Patent No.: US 7,161,657 B2
(45) Date of Patent: Jan. 9, 2007

(54) LITHOGRAPHIC APPARATUS AND DEVICE MANUFACTURING METHOD

(75) Inventor: Robrecht Emiel Maria Leonia De Weerdt, Hoogstraten (BE)

(73) Assignee: ASML Netherlands B.V., Veldhoven (NL)

( * ) Notice: Subject to any disclaimer, the term of this patent is extended or adjusted under 35 U.S.C. 154(b) by 163 days.

(21) Appl. No.: 10/910,797

(22) Filed: Aug. 4, 2004

(65) Prior Publication Data

US 2005/0030503 A1 Feb. 10, 2005

(30) Foreign Application Priority Data

Aug. 4, 2003 (EP) .................................. 03077439

(51) Int. Cl.
*G03B 27/42* (2006.01)
*G03B 27/58* (2006.01)
*G03B 27/62* (2006.01)
*H02K 41/00* (2006.01)

(52) U.S. Cl. ............................ 355/53; 355/72; 355/75; 310/12

(58) Field of Classification Search .................. 355/53, 355/72–76; 310/10, 12; 378/34, 35
See application file for complete search history.

(56) References Cited

U.S. PATENT DOCUMENTS

| 5,309,049 | A | 5/1994 | Kawada et al. |
|---|---|---|---|
| 6,151,100 | A | 11/2000 | Yamane et al. |
| 6,184,596 | B1 * | 2/2001 | Ohzeki ......................... 310/12 |
| 6,252,314 | B1 * | 6/2001 | Ebinuma ...................... 310/12 |
| 6,271,606 | B1 * | 8/2001 | Hazelton ...................... 310/12 |
| 6,437,463 | B1 | 8/2002 | Hazelton et al. |
| 6,816,232 | B1 * | 11/2004 | Takahashi et al. ............ 355/53 |
| 6,864,601 | B1 * | 3/2005 | Sogard ......................... 310/12 |

FOREIGN PATENT DOCUMENTS

| EP | 0 342 639 | 11/1989 |
|---|---|---|
| WO | WO 02/073781 | 9/2002 |

* cited by examiner

*Primary Examiner*—Henry Hung Nguyen
(74) *Attorney, Agent, or Firm*—Pillsbury Winthrop Shaw Pittman, LLP

(57) ABSTRACT

A lithographic apparatus having a positioning device that facilitates the maintenance of a conditioned environment, is presented. Embodiments of the invention include a combination of a first drive unit and a second drive unit for positioning an object table in a lithographic apparatus. The first drive unit has a first part connected to the object table and a second part connected to a first part of the second drive unit. First and second part of the first drive unit are separated from each other by a wall. Maintaining a conditioned environment surrounding the object is thereby facilitated.

21 Claims, 8 Drawing Sheets

LITHOGRAPHIC APPARATUS AND DEVICE MANUFACTURING METHOD

BACKGROUND OF THE INVENTION

1. Priority Information

This application claims priority from European Patent Application No. 03077439.2, filed Aug. 4, 2003, the contents of which is herein incorporated by reference in its entirety.

2. Field of the Invention

The present invention relates to lithographic apparatus and methods

3. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion all at once, and so-called scanners, in which each target portion is irradiated by scanning the pattern through the projection beam in a given direction (the "scanning"-direction) while synchronously scanning the substrate parallel or anti-parallel to this direction.

A conventional lithographic apparatus may be found for example, in U.S. Pat. No. 6,271,606, which describes a stage assembly including linear motors for moving an object in at least one direction whereby the object table is enclosed by a chamber.

A lithographic apparatus generally includes both a short stroke accurate positioning unit and a large stroke displacement unit for the object table. In general, the stage provided with the patterning device has large displacements in only one direction while the stage provided with the substrate has large displacements in a plane. In general, the object table provided with the patterning device or the substrate is connected to a first drive unit including a plurality of actuators or linear motors. These actuators or motors allow accurate displacement of the object over a small range. The first drive unit is usually mounted on a second drive unit that allows large displacements in at least one direction. This second drive unit may, for example, include a linear motor or a planar motor. Within a lithographic apparatus, the projection process often takes place in a purified conditioned atmosphere or in vacuum. For maintaining these conditions, the object table may be placed in an enclosing chamber. In the lithographic apparatus disclosed in U.S. Pat. No. 6,271,606, the enclosed chamber still contains at least one part of a commutating motor for large displacements. Since such motors are generally quite large and heavy, their presence inside the conditioned compartment is not advisable. An additional complication may be the requirement of a bearing for the part of the commutating motor located inside the enclosed chamber. Furthermore, it is desirable to keep the compartment in which the conditioned atmosphere is required as small as possible.

SUMMARY

Embodiments of the invention include a lithographic apparatus wherein a conditioned atmosphere or vacuum is more easily maintained. According to an embodiment of the invention a lithographic apparatus includes an illumination system configured to provide a beam of radiation; a patterning device holder configured to hold a patterning device, the patterning device serving to impart the beam of radiation with a pattern in its cross-section; a substrate holder configured to hold a substrate; a projection system configured to project the patterned beam of radiation onto a target portion of the substrate; and a positioning device configured to position at least one of the holders, the positioning device including: a first drive unit including a first part and a second part, the first part being connected to the holder to be positioned, the first part being movable relative to the second part; and a second drive unit configured to displace the first drive unit in at least one direction, the second part of the first drive unit being connected to the second drive unit, wherein the second drive unit and the second part of the first drive unit are separated from the first part of the first drive unit by a wall.

In a drive arrangement as described by the present invention, the first part of the first drive unit, being connected to the object table, is shielded from the second drive unit by a wall. Therefore, less stringent conditions regarding contamination or the use of materials can be applied to the second drive unit. Examples of such components or devices include the mask table or substrate table, the positioning devices including motors for performing the step and scan process. The requirement of having a conditioned atmosphere surrounding the mask or substrate results in a large number of restrictions that have to be dealt with during the design of these components or devices. For example, in order to maintain the required temperature in the apparatus, it may be desirable to restrict the heat generated by the motors and to remove it by proper cooling. The strict requirements regarding contamination may also lead to a restriction in the materials that can be applied. For example, in order to avoid outgassing, it may be desirable to shield components such as permanent magnets. Due to the presence of the wall separating the second drive unit from the object table, less stringent conditions can also be applied for the bearing of the second drive, i.e. a ball bearing could be applied instead of an air bearing. The wall may also, to some extent, reduce the risk of contamination by particles.

In an embodiment of the present invention, the wall separating the first part of the first drive unit from the second part, is part of a compartment. The compartment may be constructed to enclose the second part of the first drive unit and the second drive unit or may be constructed to enclose the first part of the first drive unit and the object table. In the latter case, the enclosed compartment can, for example, contain a purified atmosphere or be a vacuum compartment.

In an embodiment of the present invention, the first part of the first drive unit includes a magnet system and the second part includes an electric coil system. In this way, the current carrying components required for driving the mask table or substrate table and the mask or substrate table are located on opposite sides of the wall. In this way, the 'thermal' contamination caused by the dissipation of the electromagnetic actuators can be shielded from the object table. Therefore, the cooling of the electric coil system can be done in a more effective way. Water cooling of coils can be combined, for example, with forced air-cooling.

In an embodiment of the present invention, the first drive unit further includes a magnetic support system including a first magnet assembly connected to the first part of the first drive unit and a second magnet assembly connected to the second part of the first drive unit. By applying a magnetic support system that substantially compensates the weight of the substrate table or mask table, the first drive unit can be operated more efficiently. In order to maintain the object table at the prescribed vertical position, it is desirable to provide a vertical force on the object table. This force should be exerted continuously, i.e. at a 100% duty cycle resulting in an important source of dissipation. In case a substantial part of the weight of the object table can be compensated by a passive magnetic support system, the power consumption and dissipation may be reduced.

In an embodiment of the present invention, at least one of the drive units is a planar motor. In case the first drive unit is a planar motor, this motor may be used as a fine adjustment stage that only has a small operating range compared to the range of movements of the second drive unit. Therefore, the size of the magnet plate of the planar motor in this embodiment approximately corresponds to the size of the coil unit of the planar motor.

In an embodiment of the present invention, the lithographic apparatus further includes a base frame and a balance mass that is movably connected to said base frame, the second part of the second drive unit being connected to said balance mass. In such embodiment, the reaction force of the positioning device acts on the balance mass, not on the base frame or any other support frame of the lithographic apparatus. This enables a more accurate projection of the desired pattern onto the substrate.

In an embodiment of the present invention, the conditioned compartment is mounted on or is part of a separate frame that is dynamically isolated from the base frame. Dynamically isolating the conditioned compartment can result in a improved performance of the lithographic apparatus by reducing vibrations of the conditioned compartment and all components attached to it. The conditioned compartment may contain, for example, optical elements such as lenses or mirrors that require accurate positioning relative to the mask or substrate.

In an embodiment of the present invention, the wall that separates the first part of the first drive unit from the second part from the first drive unit is made of substantially non-magnetic material. A magnetic material would reduce the magnetic coupling between first and second part of the first drive unit.

In an embodiment of the present invention, the wall that separates the first part of the first drive unit from the second part from the first drive unit is made of substantially non-conducting material. A conducting material would result in Eddy currents generated in the wall when the first drive unit is displaced relative to the wall. These Eddy currents are an additional heat source inside the machine. Furthermore, they result in a reduced dynamic performance of the drive unit.

In case the wall separating the first part of the first drive unit from the second part from the first drive unit is in the horizontal plane, the weight of the wall may cause the wall to bent downwards if no measures are taken. A possible measure to overcome this is to provide a pressure difference between both compartments separated by the wall, that compensates the weight of the wall. An alternative is to provide an air bearing between the second part of the first drive unit and the wall to keep the wall in a predefined position relative to the second part of the first drive unit.

According to another embodiment of the invention, a drive arrangement and a positioning device are presented that can easily be assembled and disassembled. The particular drive arrangements described have a first part and a second part that can be mounted onto each other without having to disassemble one of said first and second part. Different embodiments having such properties are described, by way of example, in the accompanying figures. Although all of the cross-sectional XZ-views of the embodiments shown in the figures have a wall separating the first and second part, it will be appreciated that the presence of the wall is not mandatory for proper operation of the drive itself.

According to an embodiment of the invention, there is provided a device manufacturing method including providing a substrate that is at least partially covered by a layer of radiation-sensitive material; providing a projection beam of radiation using a radiation system; using a patterning device to endow the projection beam with a pattern in its cross-section; projecting the patterned beam of radiation onto a target portion of the layer of radiation-sensitive material; and positioning at least one of said patterning device or substrate with a positioning device including: a first drive unit including a first part and a second part, the first part being connected directly or indirectly to said object and movable relative to the second part, and a second drive unit for displacing said first drive unit in at least one direction, the second part of the first drive unit being connected to said second drive unit, and separating the first part of the first drive unit from the second part of the first drive unit by a wall.

A device manufacturing method, according to an embodiment of the invention, includes: providing a beam of radiation; patterning the beam of radiation with a pattern in its cross-section with a patterning device; projecting the patterned beam of radiation onto a target portion of the layer of radiation-sensitive material on a substrate; and positioning at least one of the patterning device and substrate with a positioning device including: a first drive unit including a first part and a second part, the first part being connected directly or indirectly to the object and movable relative to the second part, and a second drive unit configured to displace the first drive unit in at least one direction, the second part of the first drive unit being connected to the second drive unit, wherein the first part of the first drive unit is separated from the second part of the first drive unit by a wall.

A method for positioning a table in a lithographic apparatus, according to an embodiment of the invention, includes driving an object table on a first side of a wall by generating a magnetic flux on a second side of the wall, the object table being movable in response to the flux, which travels through the wall, the wall inhibiting contaminants on the second side of the wall from reaching the object table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning devices, the holding structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4b schematically depicts the magnetic field lines of the linear motor of FIG. 4a.

DETAILED DESCRIPTION

Figure 1:
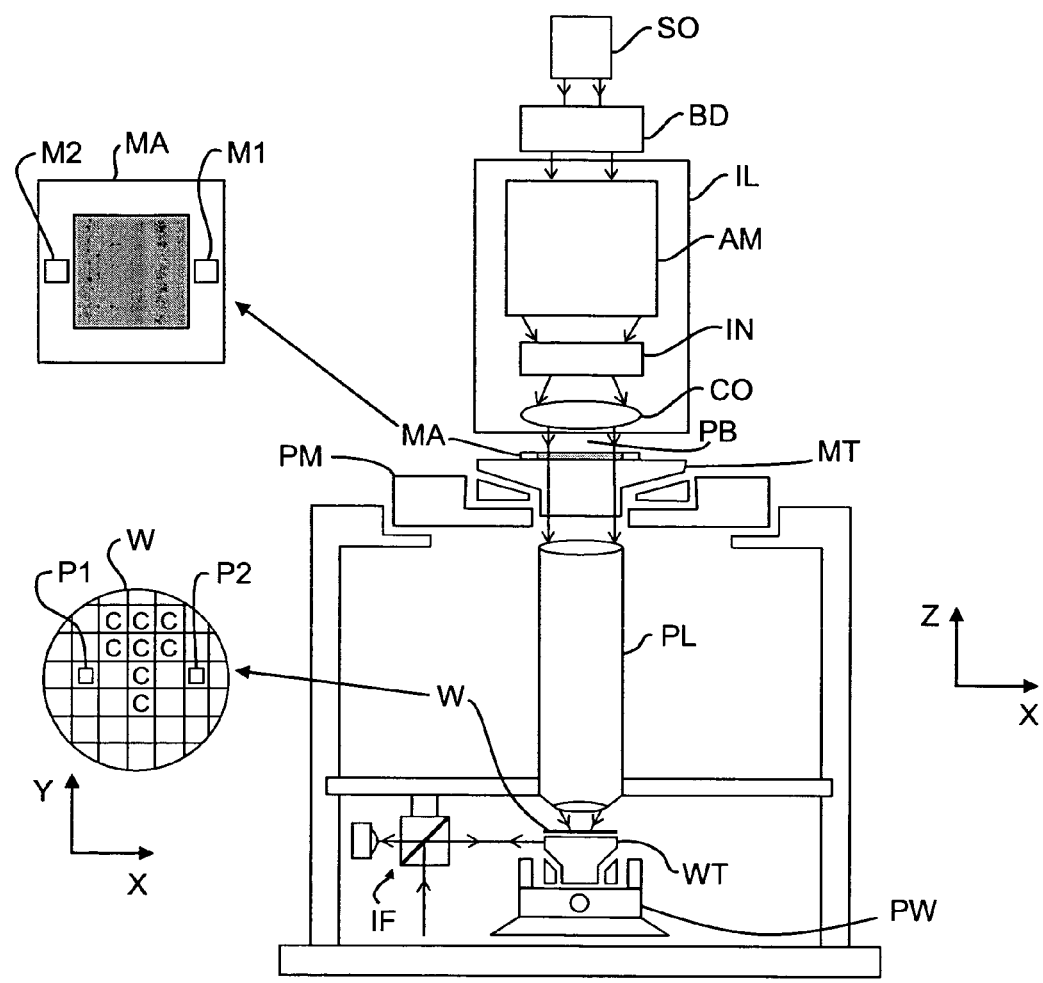
FIG. 1 depicts a lithographic apparatus according to an embodiment of the invention.

FIG. 1 schematically depicts a lithographic apparatus according to an embodiment of the invention. The apparatus includes an illumination system (illuminator) IL configured to provide a beam PB of radiation (e.g. UV radiation or EUV radiation) and a first holding structure (e.g. a mask table) MT configured to support a patterning device (e.g. a mask) MA and connected to first positioning device PM configured to accurately position the patterning device with respect to the projection system, ("lens"), item PL. The apparatus also includes a substrate table or holder (e.g. a wafer table) WT configured to hold a substrate (e.g. a resist-coated wafer) W and connected to second positioning device PW configured to accurately position the substrate with respect to the projection system, ("lens"), item PL, the projection system (e.g. a refractive projection lens) PL being configured to image a pattern imparted to the beam of radiation PB by patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may include adjusting device AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation, referred to as the beam of radiation PB, having a desired uniformity and intensity distribution in its cross-section.

The beam of radiation PB is incident on the mask MA, which is held on the mask table MT. Having traversed the mask MA, the beam of radiation PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C all at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
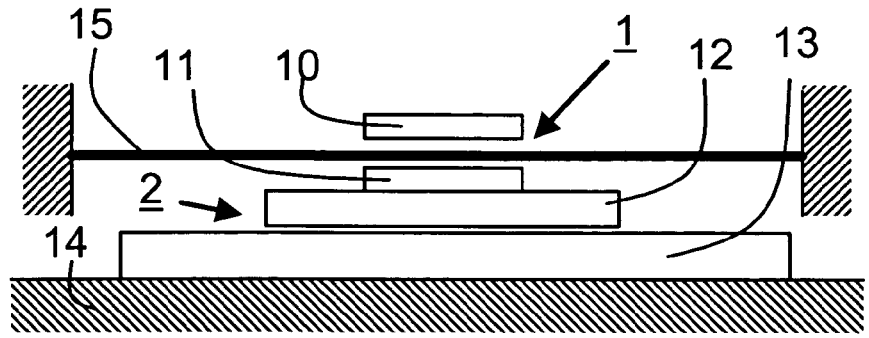
FIG. 2 schematically depicts the layout of a first and second drive unit wherein the first and second part of the first drive unit are separated by a wall.

FIG. 2 schematically depicts a first drive unit 1 mounted on a second drive unit 2. The first drive unit includes a first part 10 attached to an object table (not shown) and a second part 11 attached to a first part 12 of the second drive unit. The first part of the first drive unit is separated from the second part of the first drive unit by a wall 15. The second drive unit further includes a second part 13 that can be attached, for example, to a base frame or a balance mass 14. The first and second part of the second drive unit can be positioned relative to each other over comparatively large distances in at least one direction. Typically, the displacement larger than 500 mm can be obtained with a micrometer accuracy. As an example, the second drive unit may include a planar motor, an H-type drive or a linear motor construction. Such drive arrangements may be applied in a lithographic apparatus as shown in FIG. 1 for moving the object tables MT and WT. As the second part of the first drive unit is attached to the first part of the second drive unit, this part moves along with the first part of the second drive unit. The first drive unit is used as a fine adjustment drive. It is used to position the object table over comparatively small distances (~1 mm) with a nanometer accuracy. Since the first drive moves along with the second drive, the combined first and second drive unit may combine the advantage of allowing large displacements (obtained from the second drive unit) with a high accuracy (obtained from the first drive unit). The Lithographic apparatus further includes a wall 15 that is positioned between the first and second part of the first drive unit. This wall can be fixed to a base frame or any other frame of the lithographic apparatus. It should be clear to a person skilled in the art that in order to maintain the advantages of the combined first and second drive unit, the wall should be substantially flat and extend at least as far as the operating range of the second drive unit in the at least one direction. Particular embodiments that allow such a wall to be positioned between first and second part of the first drive unit are shown in FIGS. 4 to 16.

Figure 13:
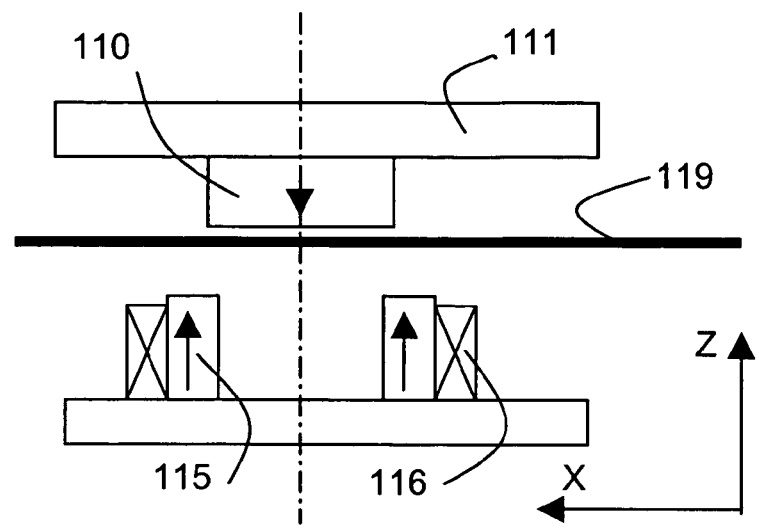
FIG. 13 schematically depicts a magnetic support system combined with a linear motor according to an embodiment of the present invention.
Figure 14:
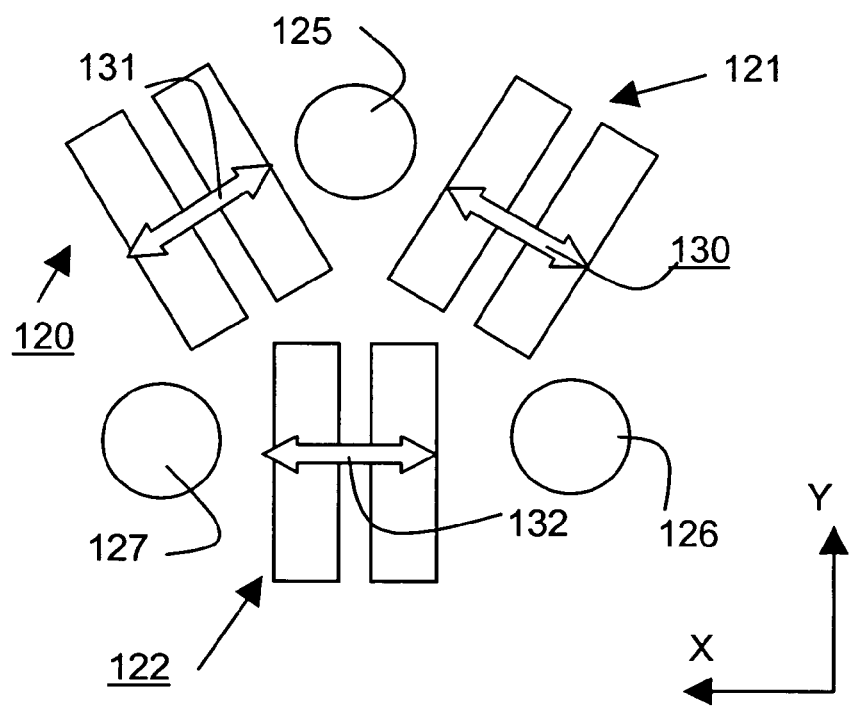
FIG. 14 schematically depicts an arrangement of linear motors and magnetic support systems according to an embodiment of the present invention.
Figure 15:
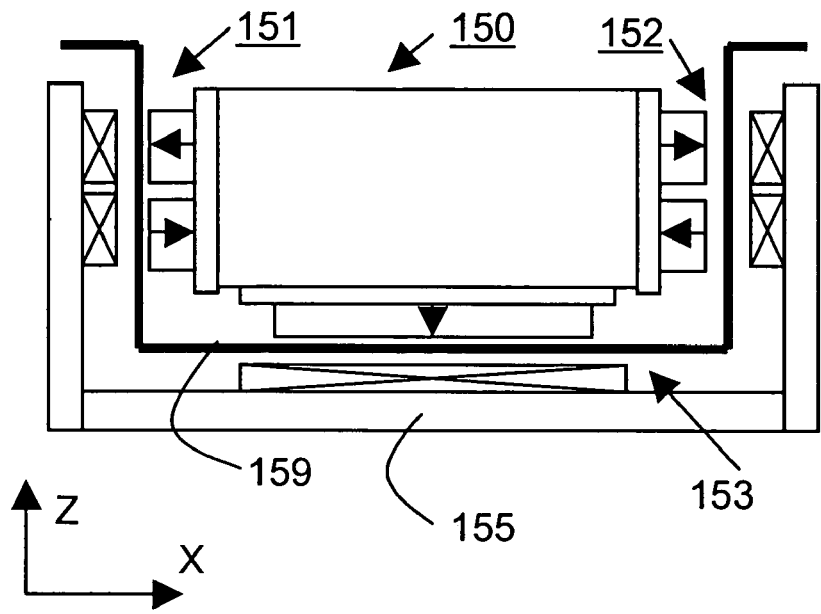
FIG. 15 schematically depicts an arrangement of linear motors and magnetic support systems according to an embodiment of the present invention.
Figure 16:
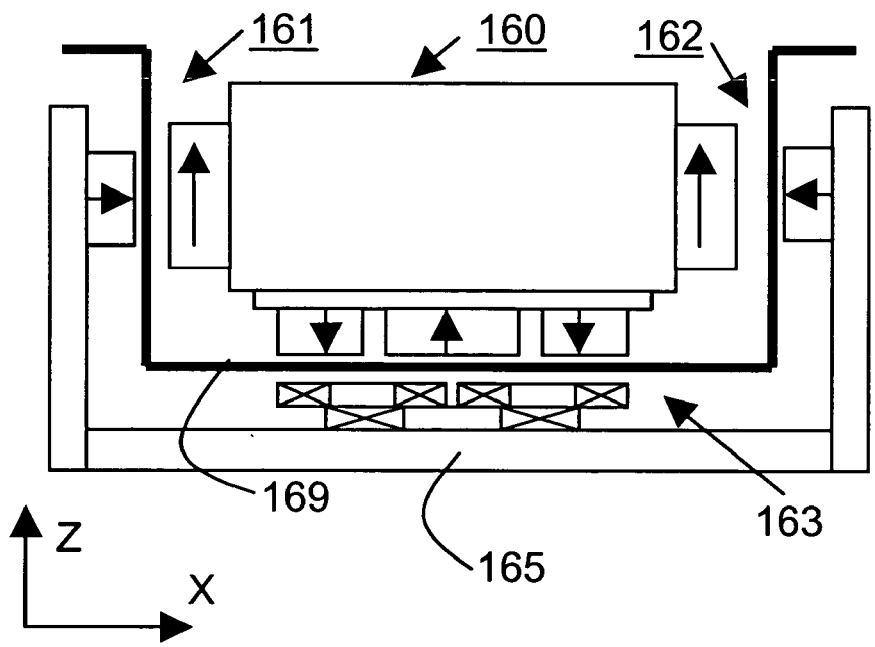
FIG. 16 schematically depicts an arrangement of linear motors and magnetic support systems according to an embodiment of the present invention.

FIGS. 4 to 14 describe embodiments of the invention that can be applied in case the object table should be displaced over comparatively large distances in a plane. FIGS. 15 to 16 describe particular embodiments that can be applied in case the object table should be displaced over comparatively large distances in only one direction. In FIGS. 3 to 16, the X-direction and Y-direction are two orthogonal directions in the horizontal plane, while the Z-direction is oriented orthogonal to said plane.

Figure 3A:
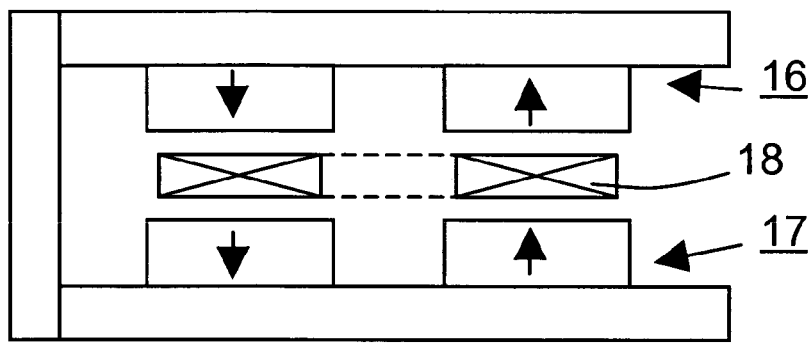
FIG. 3a schematically depicts a conventional linear motor.
Figure 3B:
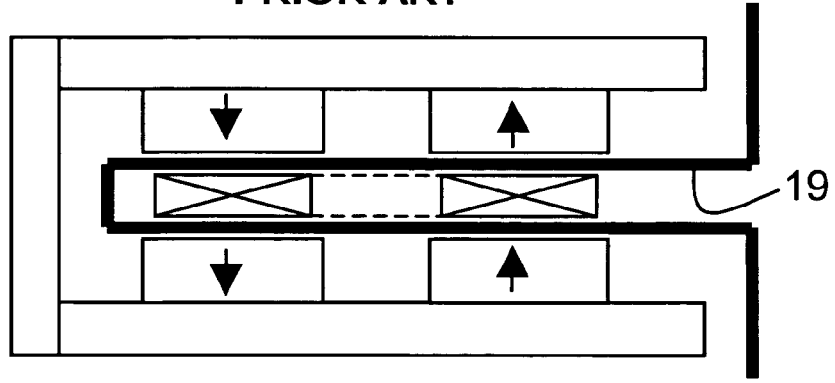
FIG. 3b schematically depicts a conventional linear motor.

FIG. 3a shows a conventional Lorentz type linear motor as is used for fine positioning in a lithographic apparatus. The linear motor consists of a first part including two magnet plates 16, 17 and a second part including a coil 18 positioned between both magnet plates. It is clear that in this configuration, no wall can be applied between first and second part that allows both motor parts to be displaced over comparatively large distances in two dimensions. FIG. 3b shows the same actuator with a wall 19 separating first part and second part. It is clear that by this wall, first and second part can only be displaced over large distances in a direction perpendicular to the plane shown in the FIG. 3b.

Figure 4A:
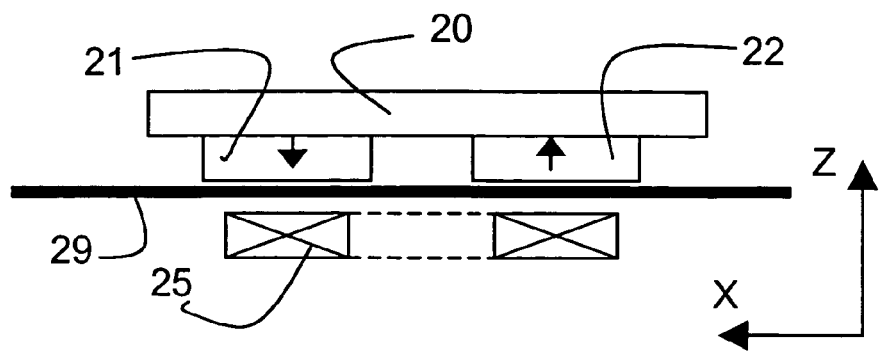
FIG. 4a schematically depicts a linear motor according to an embodiment of the present invention.
Figure 4B:
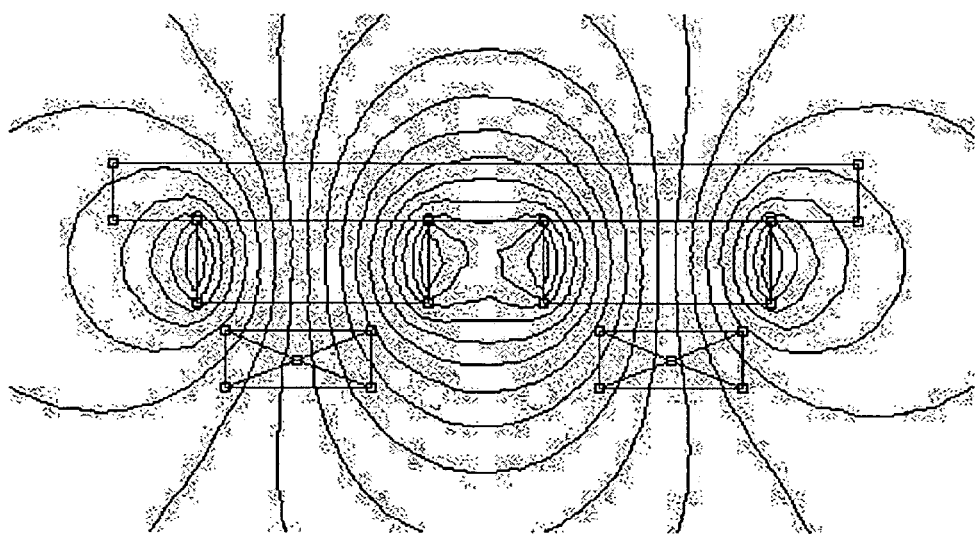

FIG. 4 shows a linear motor configuration according to an embodiment of the invention. In FIG. 4, a wall is disposed between the first and second parts to allow both motor parts to be displaced over comparatively large distances in two dimensions. The linear motor shown in FIG. 4a includes a first part that includes only one magnet plate including a back plate 20 and two magnets 21, 22 and a second part including a coil 25. The back plate 20 can be made of magnetic or non-magnetic material. In case a non-magnetic material is used, the flux density may be lower resulting in a reduced efficiency of the motor but the weight of the first part can be reduced. In between both parts, a wall 29 can be positioned. In the arrangement shown in FIG. 4, the force generated by the linear motor in case the coil is provided with a current is substantially directed in the X-direction. This is due to the fact that the magnetic flux lines cross the coil substantially in Z-direction. FIG. 4b shows the flux lines for the arrangement shown in FIG. 4a. In an alternative arrangement, the magnets and coil can be arranged in such a way that the generated force is substantially directed in the Z-direction. This can be done by changing the orientation of the magnets (FIG. 5) or by changing the position of the coil (FIG. 6).

Figure 5:
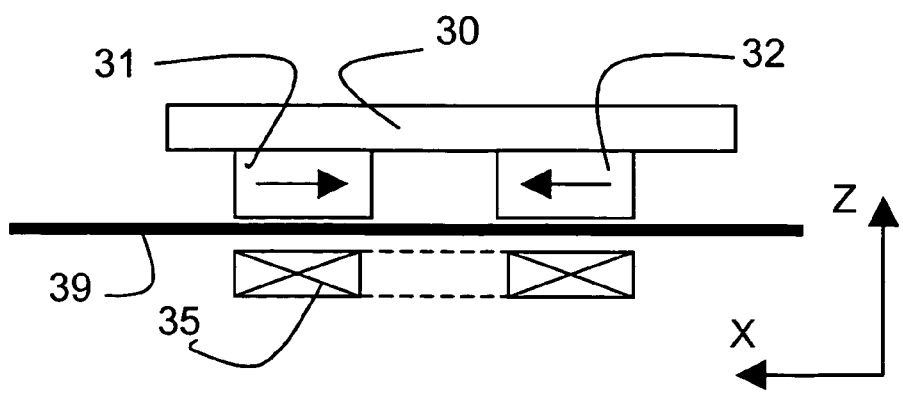
FIG. 5 schematically depicts a linear motor according to an embodiment of the present invention.

FIG. 5 shows a linear motor including one magnet plate including a back plate 30 and two magnets 31, 32 that have an opposite magnetic polarization along the X-axis. In this configuration, the magnetic flux crosses the coil substantially in X-direction, therefore, the force generated by the linear motor in case the coil is provided with a current is substantially directed in the Z-direction. A wall 39 is positioned between both parts of the linear motor.

Figure 6:
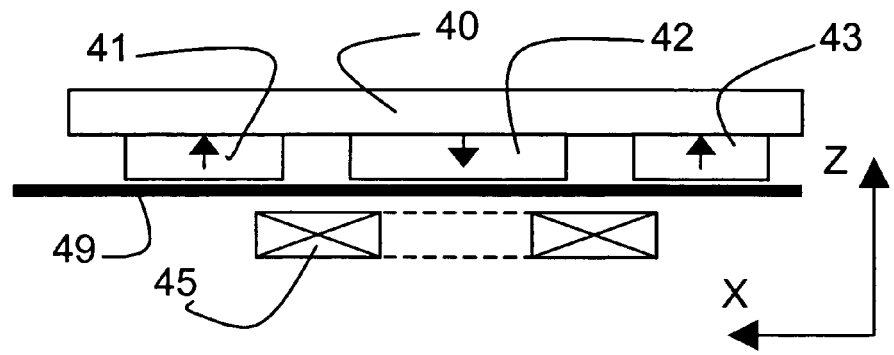
FIG. 6 schematically depicts a linear motor according to another embodiment of the present invention.

FIG. 6 shows an alternative arrangement of a linear motor configured to produce a force in Z-direction. In this arrangement, the first part of the motor includes a magnet plate including a back plate 40 and three magnets 41, 42, 43 and a second part that includes a coil 45. A wall 49 is positioned between both parts of the linear motor. Also in this configuration, the magnetic flux crosses the coil substantially in X-direction, therefore, the force generated by the linear motor in case the coil is provided with a current is substantially directed in the Z-direction.

Figure 7:
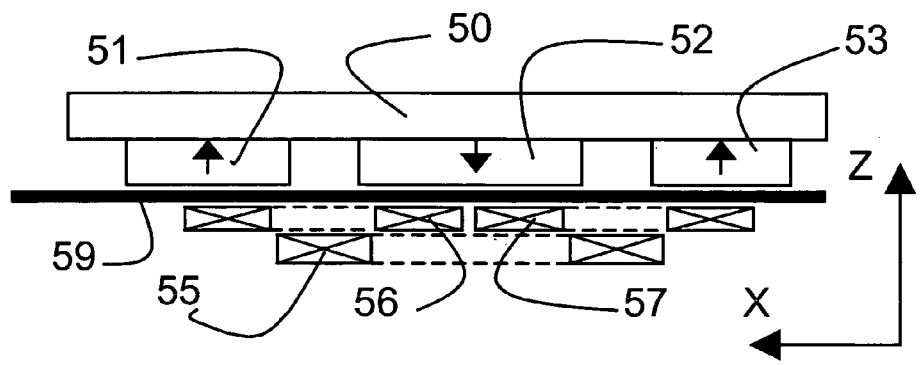
FIG. 7 schematically depicts a linear motor according to an embodiment of the present invention.

FIG. 7 shows a linear motor provided with three coils arranged relative to a magnet plate in order to provide both a force in X-direction and in Z-direction. The first part of the motor includes a magnet plate including a back plate 50 and three magnets 51, 52, 53, the second part includes three coils 55, 56, 57. The interaction between coil 55 and the magnet plate provides a force that is substantially directed in Z-direction while the interaction between coils 56 and 57 and the magnet plate provides a force that is substantially directed in X-direction. A wall 59 is positioned between both parts of the linear motor. The coil arrangement as shown in FIG. 7 has coils 56 and 57 stacked onto coil 55. It will be appreciated by the person skilled in the art that the coils can also be arranged to have their active parts in the same plane. This can be done, for example, by applying a so-called bedstead coil for coil 55. A bedstead coil has its end turns in a plane perpendicular to the plane wherein the active parts of the coil are located. This would allow coil 55 of FIG. 7 to be positioned in such a way that the active parts of the coil end up in the same plane as coils 56 and 57. In this application, the end turns may not be in a plane perpendicular to the plane wherein the active parts of the coil are located. It is sufficient to bend the end turns of the coil 55 (in negative Z-direction according to FIG. 7) until the active parts of the coil 55 can be positioned at the same Z-position as coils 56 and 57.

Figure 8:
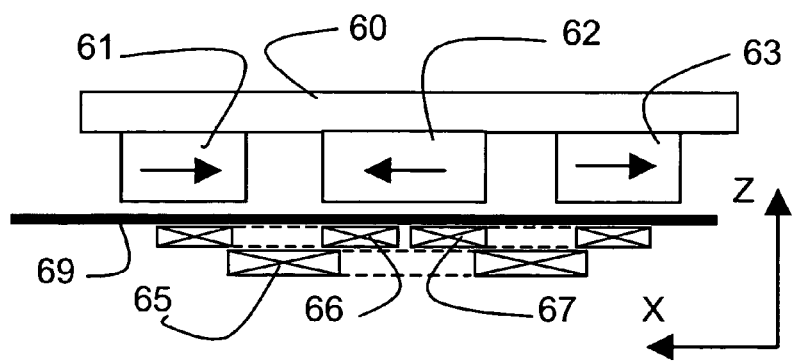
FIG. 8 schematically depicts a linear motor according to an embodiment of the present invention.

Another embodiment of the invention is shown in FIG. 8 wherein the magnet orientation is different from the one shown in FIG. 7. In this case, the interaction of coils 66 and 67 provides a force in Z-direction, the interaction between coil 65 with the magnet plate provides a force substantially direction in X-direction. A wall 69 is positioned between both parts of the linear motor.

Figure 9:
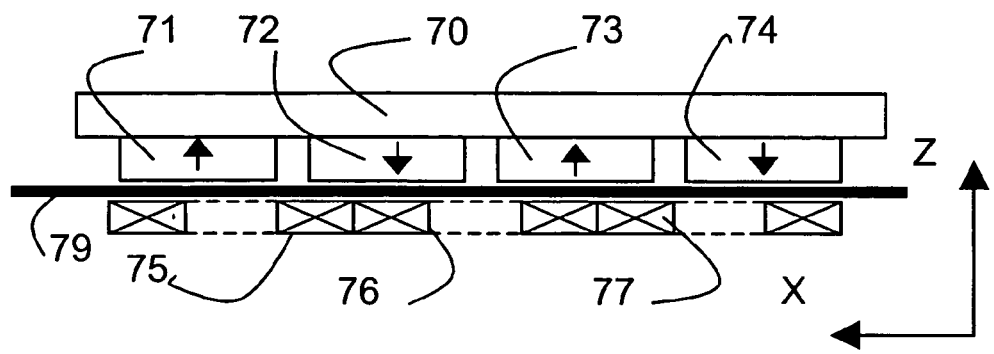
FIG. 9 schematically depicts a linear motor according to an embodiment of the present invention.

FIG. 9 shows a linear motor according to an embodiment of the invention. In this arrangement, the first part of the first drive unit includes a magnet plate including a back plate 70 and four magnets 71, 72, 73, 74, the second part of the first drive unit includes a coil system including three coils 75, 76, 77 that can be supplied from a conventional three-phase current source. Depending on the amplitude of the current in the different coils 75, 76, 77, a force can be generated in the XZ-plane. A wall 79 is positioned between both parts of the linear motor.

Figure 10A:
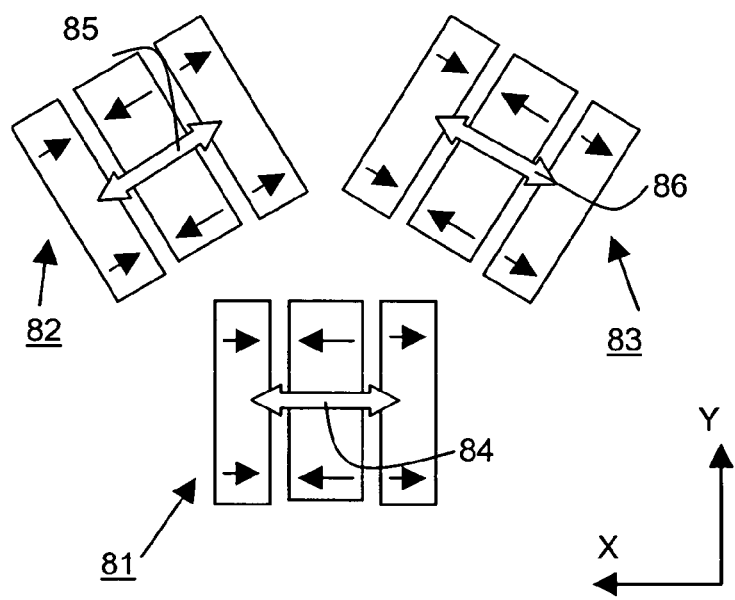
FIG. 10a schematically depicts an arrangement of linear motors according to an embodiment of the present invention.
Figure 10B:
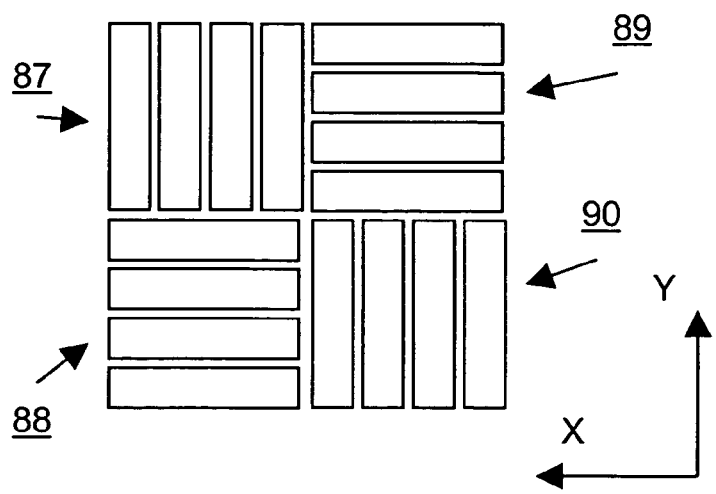
FIG. 10b schematically depicts an arrangement of linear motors according to another embodiment of the present invention.

Arrangements as shown in FIGS. 7, 8 and 9 allow positioning of the magnet plate relative to the coil system in two degrees of freedom. It will be appreciated that by combining at least three of such arrangements, positioning in 6 degrees of freedom can be obtained. FIGS. 10a and 10b show an XY-view of a magnet arrangements for obtaining the 6 degrees of freedom, according to an embodiment of the invention. FIG. 10a shows three magnet arrangements 81, 82, 83 as found in FIG. 8. Each of these magnet arrangements together with their respective coil system (not shown) can generate a force in the XY-plane (indicated by the arrows 84, 85, 86) and a force in Z-direction. The magnet arrangements 81, 82, 83 may each have their own back plate or can be attached to a common back plate. FIG. 10b shows an arrangement where four of the magnet arrangements of FIG. 9 are combined. Each of the four magnet arrangements 87, 88, 89, 90 together with their respective coil assemblies (not shown) can provide a force including a component in Z-direction and a component in X or Y direction. In the arrangement shown in FIG. 10b, magnet assemblies 87 and 90 can provide a force in X-direction, and magnet assemblies 88 and 89 can provide a force in Y-direction.

It will be appreciated that the linear motors and motor arrangements shown in FIGS. 4 to 10 have particular advantages with respect to assembly and disassembly compared to the actuator shown in FIG. 3a. The coil 18 in FIG. 3a has to be inserted by a movement in the XY-plane into the appropriate position relative to the magnet plates. In case a plurality of actuators is to be used, e.g. to obtain six degrees of freedom positioning, this may become a difficult and time consuming operating compared to a drive arrangement as shown in FIGS. 10*a* and 10*b* where the complete coil unit and the magnet assembly can be assembled independent of each other. It will be appreciated that with a linear motor having one magnet plate instead of two, the weight of the magnet assembly may be reduced. This is advantageous since in many applications the magnet assembly is attached to the object table while the coil assembly is mounted on a second drive unit. One of the reasons for doing so is to reduce the thermal contamination of the object table by the dissipation in the coil unit. Reducing the weight of the magnet assembly can therefore reduce the mass to be accelerated and therefore the force requirement of the drive. It will also be appreciated that with the linear motors and motor arrangements shown in FIGS. 4 to 10, cooling of the coil may be easier and can be more effective since the coil is not enclosed by two magnet plates.

In case the magnet assembly of the first drive unit is attached to the object table and the coil assembly is mounted on a second drive unit, a further advantage may be found in powering the first drive unit. In such an arrangement, the coil assembly is separated from the object table by the separation wall. Therefore, the wiring of the coils is kept outside the conditioned compartment. By attaching the magnet assembly to the object table, no mechanical contact such as wiring is required between the object table and the outside of the compartment. In case the coil assembly is attached to the object table, wiring of the coils may create a mechanical shortcut between the object table and the outside of the compartment. Such a mechanical shortcut may hinder the accurate positioning of the object table. By arranging the coil assembly of the first drive unit outside a compartment enclosing the object table, accurate positioning of the object table can be obtained. Such an arrangement may also be desirable with respect to contamination: In case the object table is provided in conditioned environment (e.g. an inert gas atmosphere or vacuum), the material applied in conventional coil assemblies (e.g. insulation materials) may contaminate the surrounding of the object (e.g. by outgassing). When both the coil assembly of the first drive unit and the entire second drive unit are outside the conditioned compartment, less stringent conditions apply with respect to the choice of materials.

Figure 11:
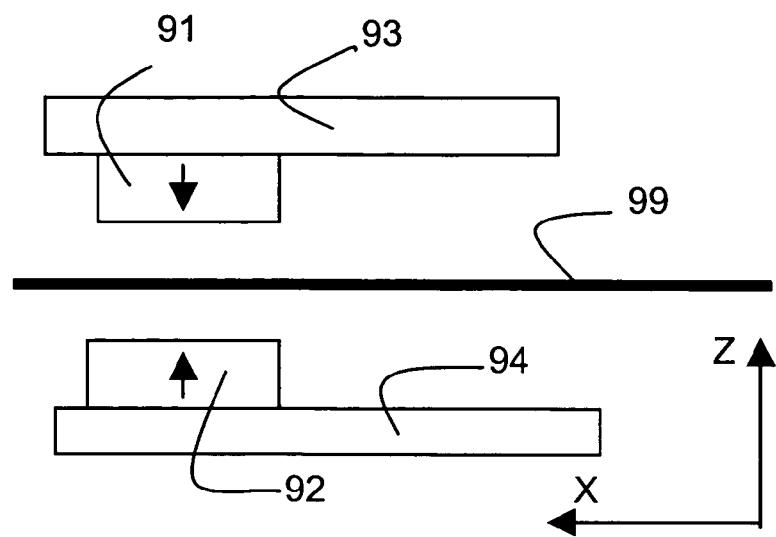
FIG. 11 schematically depicts a magnetic support system according to an embodiment of the present invention.
Figure 12:
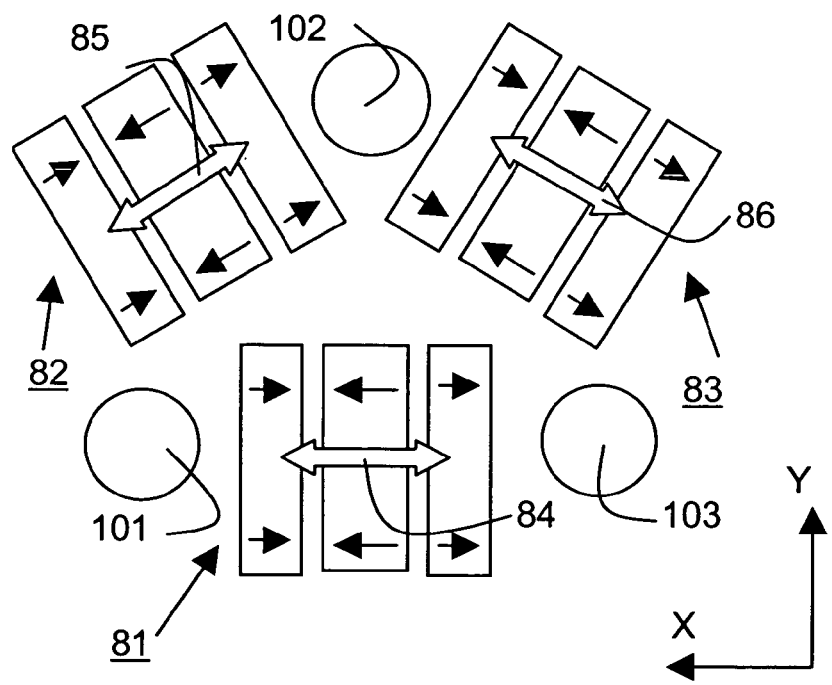
FIG. 12 schematically depicts an arrangement of linear motors and magnetic support systems according to an embodiment of the present invention.

The first drive unit can be made more efficient by including a passive magnetic support system. Such passive magnetic support system includes a first magnet assembly attached to the first part of the first drive unit and a second magnet assembly attached to the second drive unit. First and second magnet assembly are arranged relative to each other in such a way that a repelling force exists between both magnet assemblies. The design and material choice of the magnets of the magnet assemblies is such that the repelling force substantially compensates the weight of the object table together with the first part of the first drive unit. Furthermore, the arrangement of both magnet assemblies much be such that a wall of the conditioned compartment can be positioned between both assemblies allowing comparatively large displacements in both X and Y-direction. FIG. 11 shows a possible magnet arrangement including the wall of the conditioned compartment. The magnetic support system includes a first magnet assembly that includes one magnet 91 attached to a back plate 93 that is part of the first part of the first drive unit and a second magnet assembly that includes one magnet 92 attached to a back plate 94 that is part of the second part of the first drive unit and counteracts with the magnet 91 of the first part of the first drive. Magnets 91, 92 may have, for example, a cylindrical or rectangular shape. A wall 99 is positioned between both parts of the magnetic support system. It will be appreciated that to improve stability with respect to tilting around X- or Y-axis, it may be desirable to apply a plurality of such assemblies between first and second part of the drive unit. In an embodiment of the invention, three of such assemblies arranged in a triangle are applied. FIG. 12 shows a linear motor according to an embodiment of the invention, which includes the magnet plate of the first drive unit taken from FIG. 10. In FIG. 12, three disc-shaped magnets 101, 102, 103, magnetized in Z-direction are arranged together with the magnets required for the 6DOF (six degrees of freedom) positioning of the object table. The counteracting magnets of the magnetic support system and the coils of the second part of the first drive unit are not shown.

In another embodiment of the invention, the magnetic support system can further be equipped with a coil system to vary the bias force generated by the magnetic support system. FIG. 13 shows a possible arrangement. The arrangement shown in FIG. 13 includes a first magnet assembly including a disc-shaped magnet 110 attached to a back plate 111 that is part of the first part of the first drive unit. The first magnetic assembly further includes a second magnet assembly including a cylindrical magnet 115 and a coil 116 surrounding the magnet. The coil may as well be located inside the cylindrical magnet, or two coils may be applied. Energizing the coil or coils will result in an increase or a decrease in the force acting between both magnet assemblies depending whether the magnetic field generated by the coil or coils is directed parallel or anti-parallel to the magnet field generated by the cylindrical magnet 115. A wall 119 is positioned between both parts of the combined linear motor—magnetic support system. If three of such systems are used, this arrangement can be used for positioning the object table in Z-direction and for tilting the object table around X and Y axis. In this case, the magnet system and coil system of the first drive unit as described in FIGS. 7, 8 or 9 can be simplified. Using three of such arrangements combined with three arrangements as shown in FIG. 4 allow an accurate 6DOF positioning of the object table. FIG. 14 shows a possible lay-out (X-Y view) combining three magnetic support systems 125, 126, 127 according to FIG. 13 and three linear motors 120, 121, 122 according to FIG. 4. In this arrangement, there is a clear separation between the actuators (or motors) that provide the force in Z-direction and the motors that provide a force in the XY-plane. This separation can result in a reduced cross-talk between the individual motors. Some cross-talk may exist in the linear motor shown in FIG. 7, i.e. a current in coil 55 may influence the force generated by the coils 56 and 57 on the magnet plate in X-direction. By separating the motors, this cross-talk can be reduced. In the arrangement shown in FIG. 14, a common back plate for all motors and magnetic support systems may be applied.

In case the object table only has to be displaced over large distances in one direction, the wall separating first and second part of the first drive unit may only be substantially flat in the one direction. This provides additional freedom in the actuator and magnetic support design as is shown in the following figures. FIG. 15 shows a cross section of a possible actuator arrangement, according to an embodiment of the invention, attached to an object table that allows a large displacement in one direction. The cross-section shows a stage assembly 150 including three magnet assemblies that can be attached to an object table or can be part of the object table. Adjacent to each magnet assembly and arranged to cooperate with the magnet assemblies are three coil units. The coil units together with the respective magnet assemblies form three actuator units 151, 152, 153. The coil units of the actuator units are connected to a stage member 155 that can be mounted on the second drive unit (not shown). The actuators are used to accurately position the stage assembly 150. The actuators only allow for small relative displacements of the assembly 150 relative to the stage member 155. However, by mounting the stage member on a second drive unit that allows large displacements in Y-direction, the stage assembly can both be accurately positioned (by the actuators 151, 152, 153) and displaced over large distances in Y-direction. The wall 159 as shown in FIG. 15 only includes surfaces that are either parallel to the XY-plane or to the YZ-plane and therefore allows both the stage assembly 150 and stage member 155 to make such large displacements in Y-direction.

Actuators 151 and 152 can be used to position the stage assembly 150 in Z-direction or to rotate the assembly around the Y-axis. The actuator 153 can be an actuator assembly as shown in FIG. 7 or 8 but oriented to provide a force in Y-direction and Z-direction.

Similarly to the embodiments of the invention described in FIGS. 11 to 14, the efficiency of the drive unit can be improved by including a magnetic support system in the drive unit. FIG. 16 shows a XZ cross section of a possible configuration, according to an embodiment of the invention. FIG. 16 shows a stage assembly 160 including three magnet assemblies. The figure shows two magnetic support systems 161 and 162, each including two magnet assemblies. The magnetic supports provide a force acting in Z-direction between the stage assembly 160 and the stage member 165. The arrangement further includes an actuator assembly as shown in FIG. 7 and oriented in such a way that a force in X-direction and in Z-direction can be applied between parts 165 and 160. It will be appreciated by a person skilled in the art that actuator assemblies as shown in FIGS. 5 to 10 and magnetic support assemblies as shown in FIGS. 11 to 13 could also be applied in the embodiments shown in FIGS. 15 and 16 both in the XY plane and in the YZ plane. It will be appreciated by a person skilled in the art that the efficiency of the linear motors or actuators shown in the embodiments can be improved by applying a so-called Halbach array in the magnet assemblies.

While specific embodiments of the invention have been described above, it will be appreciated that the invention may be practiced otherwise than as described. The description is not intended to limit the invention, rather the scope of the invention is defined by the appended claims.

What is claimed is:

1. A lithographic apparatus comprising:
    an illumination system configured to condition a beam of radiation;
    a patterning device holder configured to hold a patterning device, the patterning device serving to impart the beam of radiation with a pattern in its cross-section;
    a substrate holder configured to hold a substrate;
    a projection system configured to project the patterned beam of radiation onto a target portion of the substrate; and
    a positioning device configured to position at least one of said holders, said positioning device comprising:
        a first drive unit comprising a first part and a second part, the first part being connected to the holder to be positioned, said first part movable relative to the second part; and
        a second drive unit configured to displace said first drive unit in at least one direction, the second part of the first drive unit being connected to said second drive unit,
    wherein the second drive unit and the second part of the first drive unit are separated from the first part of the first drive unit by a wall.

2. The lithographic apparatus of claim 1, wherein said wall is part of a compartment enclosing the first part of the first drive unit and said patterning device holder or substrate holder.

3. The lithographic apparatus of claim 1, wherein said wall is part of a compartment enclosing the second part of the first drive unit and the second drive unit.

4. The lithographic apparatus of claim 1, wherein the first part of the first drive unit comprises a magnet system and the second part comprises an electric coil system.

5. The lithographic apparatus of claim 1, wherein the first drive unit further comprises a magnetic support system comprising a first magnet assembly connected to the first part of the first drive unit and a second magnet assembly connected to the second part of the first drive unit.

6. The lithographic apparatus of claim 1, wherein the second drive unit is a planar motor.

7. The lithographic apparatus of claim 1, wherein said patterning device holder or substrate holder is positioned to enable six degrees of freedom by said first drive unit.

8. The lithographic apparatus of claim 1, wherein the wall is made of substantially non-magnetic material.

9. The lithographic apparatus of claim 1, wherein the wall is made of substantially non-conducting material.

10. The lithographic apparatus of claim 1, wherein the first drive unit further comprises an air bearing configured to maintain the wall of the conditioned compartment at a predefined distance relative to the second part of the first drive unit.

11. The lithographic apparatus of claim 1, wherein the wall is a substantially flat wall.

12. The lithographic projection apparatus of claim 1, wherein a pressure difference exists between adjacent compartments separated by the wall.

13. The lithographic projection apparatus of claim 4, wherein the magnet system includes a first magnet and a second magnet having opposed orientations of magnetization.

14. The lithographic projection apparatus of claim 13, wherein a direction of magnetization of the first and the second magnet is substantially perpendicular to a direction of support of said first part.

15. The lithographic projection apparatus of claim 1, wherein said wall extends over a distance at least as long as the operating range of the second drive unit in said at least one direction.

16. The lithographic apparatus of claim 1, wherein the first drive unit is constructed and arranged such that the first part is moveable with respect to the second part in two dimensions.

17. A positioning device for positioning an object table, comprising:
    a first drive unit comprising a first part and a second part, the first part being connected to said object table and movable relative to the second part; and a second drive unit configured to displace said first drive unit in at least one direction, the second part of the first drive unit being connected to said second drive unit, wherein the second drive unit and the second part of the first drive unit are separated from the first part of the first drive unit by a wall.

18. The positioning device of claim 17, wherein the object table is a substrate table for holding a substrate.

19. The positioning device of claim 17, wherein the object table is configured to hold a patterning device.

20. The positioning device of claim 17, wherein the first drive unit is constructed and arranged such that the first part is moveable with respect to the second part in two dimensions.

21. A device manufacturing method comprising:

providing a beam of radiation;

patterning the beam of radiation with a pattern in its cross-section with a patterning device;

projecting the patterned beam of radiation onto a target portion of the layer of radiation-sensitive material on a substrate; and positioning said patterning device or said substrate with a positioning device comprising:

a first drive unit comprising a first part and a second part, the first part being connected directly or indirectly to said patterning device or said substrate and movable relative to the second part, and a second drive unit configured to displace said first drive unit in at least one direction, the second part of the first drive unit being connected to said second drive unit, wherein the first part of the first drive unit is separated from the second part of the first drive unit by a wall.

* * * * *